United States Patent
Swami et al.

(10) Patent No.: US 6,879,185 B2
(45) Date of Patent: Apr. 12, 2005

(54) LOW POWER CLOCK DISTRIBUTION SCHEME

(75) Inventors: Parvesh Swami, New Delhi (IN); Namerita Khanna, New Delhi (IN); Deepak Agarwal, Noida (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 6 days.

(21) Appl. No.: 10/407,801

(22) Filed: Apr. 4, 2003

(65) Prior Publication Data

US 2003/0218480 A1 Nov. 27, 2003

(30) Foreign Application Priority Data

Apr. 5, 2002 (IN) ..................................... 431/DEL/2002

(51) Int. Cl.[7] .............................................. H03K 19/00
(52) U.S. Cl. .............................. 326/93; 326/41; 326/47; 326/101; 327/141; 327/144; 327/145
(58) Field of Search ............................... 326/37–41, 46, 326/47, 101, 93; 327/141, 144, 152, 153, 161

(56) References Cited

U.S. PATENT DOCUMENTS

| | | | | |
|---|---|---|---|---|
| 5,578,946 A | * | 11/1996 | Carberry et al. | 326/93 |
| 5,592,106 A | * | 1/1997 | Leong et al. | 326/41 |
| 5,652,529 A | | 7/1997 | Gould et al. | |
| 5,703,498 A | | 12/1997 | Gould et al. | |
| 5,923,188 A | * | 7/1999 | Kametani et al. | 326/93 |
| 5,990,702 A | * | 11/1999 | Agrawal et al. | 326/41 |
| 6,333,641 B1 | * | 12/2001 | Wasson | 326/39 |
| 6,552,590 B2 | * | 4/2003 | Pratt et al. | 327/295 |
| 6,667,645 B1 | * | 12/2003 | Fletcher et al. | 327/200 |
| 6,714,057 B2 | * | 3/2004 | Nguyen | 327/115 |

* cited by examiner

*Primary Examiner*—Vibol Tan
(74) *Attorney, Agent, or Firm*—Lisa K. Jorgenson; Bryan A. Santarelli; Graybeal Jackson Haley LLP

(57) ABSTRACT

An electronic circuit containing one or more digital synchronous sequential logic blocks at least one of which is either selected or deselected during operation. The electronic circuit includes an improved clock distribution scheme that reduces power consumption, comprising identifying means for determining the select/deselect state of each said deselectable synchronous sequential logic block, coupled to disabling means for disabling the clock input to each deselected synchronous sequential logic block.

35 Claims, 8 Drawing Sheets

LOW POWER CLOCK DISTRIBUTION SCHEME

PRIORITY

This application claims priority from Indian patent application No. 431/Del/2002, filed Apr. 5, 2002, which is incorporated herein by reference.

FIELD OF THE INVENTION

The invention relates generally to clock distribution in electronic circuits. In particular, the invention relates to reduction of power consumption by selective enabling of clock signals.

BACKGROUND OF THE INVENTION

A vast majority of digital electronic circuits include synchronous sequential logic circuits that require a clock signal for their operations. One or more clock signals are distributed to every part of the circuit containing such synchronous sequential logic circuits. For large circuits, it is a general practice to organize the clock distribution as a hierarchical arrangement in the form of a "clock tree" that distributes the clock over the entire circuit.

The power consumption of an electronic circuit is largely dependant on the switching of the logic circuits in response to the clock signal because the static power consumption, especially for CMOS circuits that are widely used in electronic devices, is extremely low. The predominant dynamic power consumption is the result of charging and discharging of internal and external capacitors. Increased power dissipation also results in reduced reliability as the circuit components operate at a higher temperature. The increased power dissipation may also require the use of expensive packaging and/or heat dissipation arrangements to manage the heat generated, thereby resulting in increased cost.

In several applications or under certain conditions in a given application, some synchronous, sequential-logic circuits are not in use. This condition may arise frequently in programmable devices such as Field Programmable Gate Arrays (FPGAs) depending on the program used. Current circuit arrangements supply the clock signal to all points whether or not the synchronous, sequential logic at those points is in use. For example, the clock signal in a clock tree is supplied to all branches and leaves regardless or whether a particular leaf or branch is in use or not. This scheme results in wasted power. In the case of FPGAs, this inefficiency can result in limitations on gate density and/or maximum clock speed. The consumption of power can be reduced by selectively enabling only the clock to only those leaves or branches of the clock tree that are connected to active sequential circuits.

U.S. Pat. Nos. 5,652,529 and 5,703,498 disclose a method for selective enabling of a clock tree by selectively switching of the clock in column and sector arrangements. However, these inventions merely provide a selection mechanism, leaving the actual selection of branch and leaf to the programmer. This results in a process that is relatively complex and inefficient to control the clock tree.

SUMMARY OF THE INVENTION

An embodiment of the invention provides an improved clock distribution architecture that reduces power consumption and provides a mechanism that implements the selection or deselection of the clock signals automatically based on circuit operation.

Another embodiment of the invention provides a scheme that implements selective clock enabling in a multi-level hierarchical clock tree.

As such, one embodiment of the invention provides, in an electronic circuit containing one or more digital synchronous sequential logic blocks, at least one of which is either selected or deselected during operation, an improved clock distribution scheme that reduces power consumption, comprising: identifying means for determining the select/deselect state of each said deselectable synchronous, sequential-logic block, coupled to disabling means for disabling the clock input to each deselected synchronous, sequential logic block.

The said identifying means includes a logic circuit that receives the select/deselect signal for each synchronous, sequential logic block as an input and provides a defined logic signal when all its inputs are in the deselected state.

The said disabling means includes a logic circuit for gating the clock signal to said synchronous, sequential logic blocks.

The clock distribution is arranged in a hierarchical structure and an identifying means and a disabling means is provided for each level of clock hierarchy.

The said identifying means for a higher level of the clock hierarchy receives the outputs from the disabling means at the next lower level of the clock distribution hierarchy at its inputs.

The said disabling means for a particular level of the clock hierarchy receives the output from the identifying means at the same level of the clock hierarchy.

An embodiment of the present invention further provides in a programmable logic device containing one or more digital synchronous sequential logic blocks at least one of which is either selected or deselected during operation, an improved clock distribution scheme that reduces power consumption, comprising: identifying means for determining the select/deselect state of each said deselectable synchronous sequential logic block, coupled to disabling means for disabling the clock input to each deselected synchronous sequential logic block.

The said identifying means includes a logic circuit that receives the select/deselect signal for each synchronous sequential logic block as an input and provides a defined logic signal when all its inputs are in the deselected state.

The said disabling means includes a logic circuit for gating the clock signal to said synchronous sequential logic blocks.

The clock distribution is arranged in a hierarchical structure and an identifying means and a disabling means is provided for each level of clock hierarchy.

The said identifying means for a higher level of the clock hierarchy receives the outputs from the disabling means at the next lower level of the clock distribution hierarchy at its inputs.

The said disabling means for a particular level of the clock hierarchy receives the output from the identifying means at the same level of the clock hierarchy.

Another embodiment of the invention provides in a programmable gate array (PGA) containing one or more digital synchronous sequential logic blocks at least one of which is either selected or deselected during operation, an improved clock distribution scheme that reduces power consumption, comprising: identifying means for determining the select/deselect state of each said deselectable synchronous sequential logic block, coupled to disabling means for disabling the clock input to each deselected synchronous sequential logic block.

The said identifying means includes a logic circuit that receives the select/deselect signal for each synchronous sequential logic block as an input and provides a defined logic signal when all its inputs are in the deselected state.

The said disabling means includes a logic circuit for gating the clock signal to said synchronous sequential logic blocks.

The clock distribution is arranged in a hierarchical structure and an identifying means and a disabling means is provided for each level of clock hierarchy.

The said identifying means for a higher level of the clock hierarchy receives the outputs from the disabling means at the next lower level of the clock distribution hierarchy at its inputs.

The said disabling means for a particular level of the clock hierarchy receives the output from the identifying means at the same level of the clock hierarchy.

Another embodiment of the present invention provides a method for reducing power consumption in an electronic circuit containing one or more digital synchronous sequential logic blocks at least one or which is either selected or deselected during operation, comprising the steps of: identifying the select/deselect state of each deselectable logic block, and disabling the clock input to each deselected logic block.

The select/deselect state of each deselectable logic block is determined by monitoring its select/deselect control signal.

The clock input to each deselected logic block is disabled by gating it with a control signal The above method can be applied to a hierarchical clock distribution arrangement wherein the identification and disabling is implemented for each level of the clock hierarchy.

The disabling for a particular level of the clock hierarchy is based on the monitoring of the disabling signals for the lower levels of the clock hierarchy.

BRIEF DESCRIPTION OF THE DRAWINGS

The invention will now be described with reference to the accompanying drawings.

DETAILED DESCRIPTION

Figure 1:
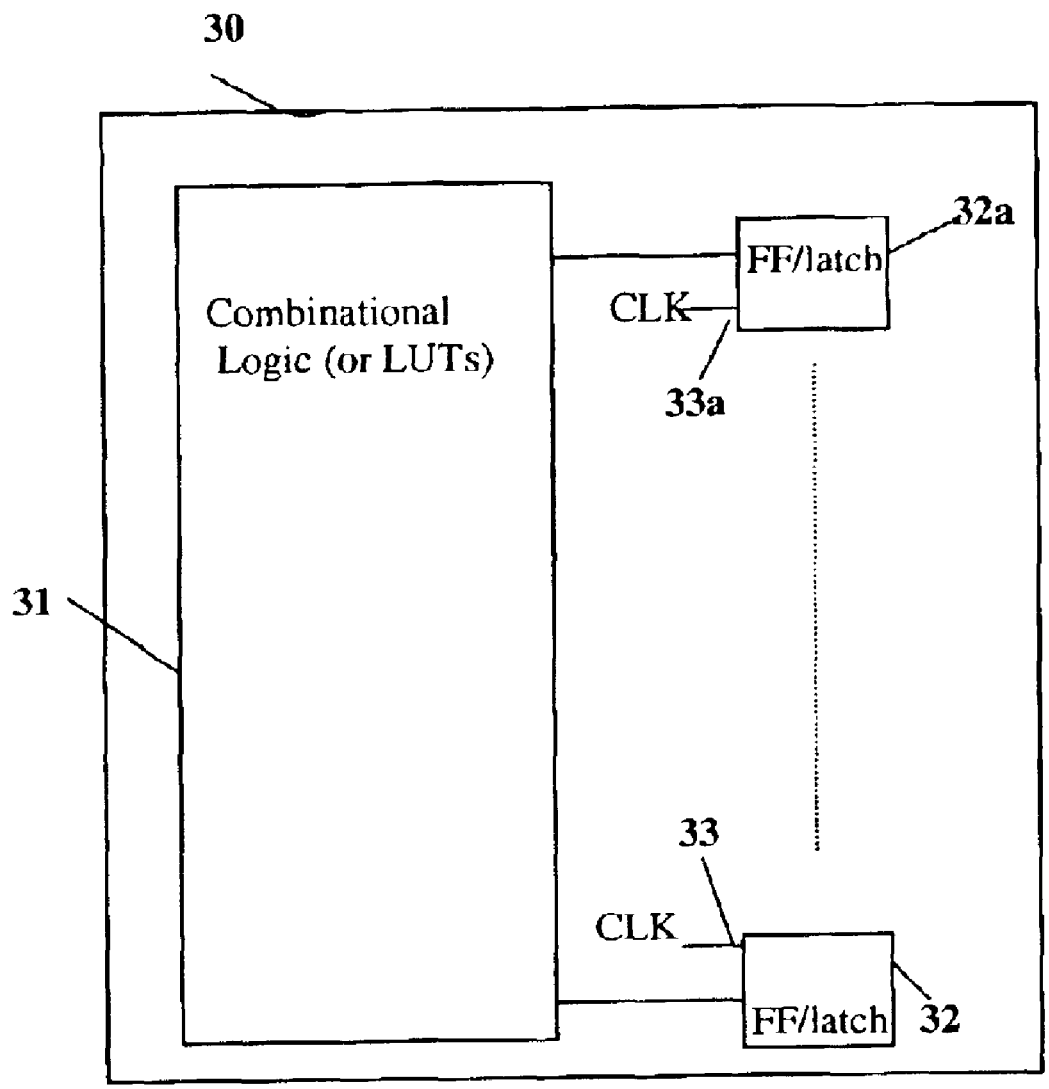
FIG. 1 shows a block diagram of a conventional programmable logic block (PLB) using sequential elements (flip flops/latch).

FIG. 1 shows the block diagram of a Programmable Logic Block (PLB) 30, of the type used in an FPGA, according to the prior art. The PLB contains one or more Look Up Tables (LUTs) 31 that define programmable, combinational-logic functions. The output of each LUT 31 is connected to a Flip Flop/Latch 32–32a. All the latches 32–32a in a PLB 30 share a common clock signal Clk 33–33a. Various combinational or sequential logic functions can be obtained by programming the LUT 31 suitably and selecting either the latched output or the combinational signal at the input of the latch 32–32a.

Figure 2:
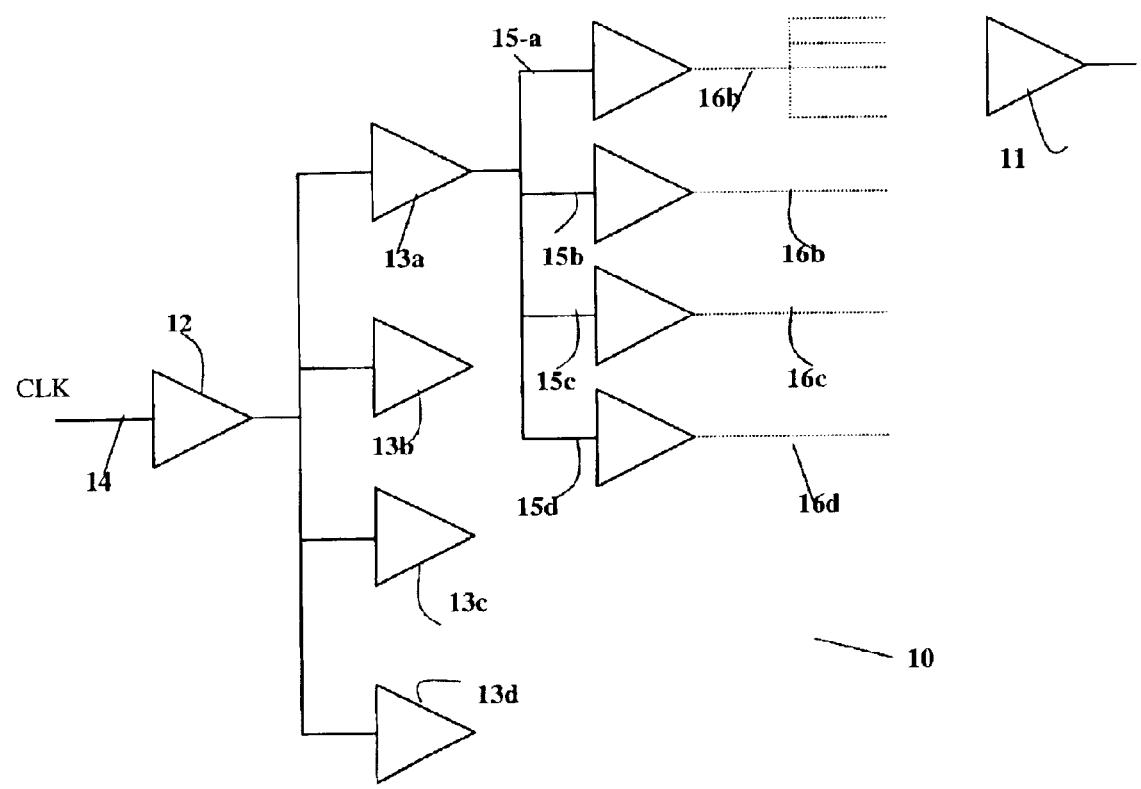
FIG. 2 shows a conventional clock tree using buffers (or inverters).

FIG. 2 shows a typical clock tree structure 10, according to prior art, used for supplying the clock signal to the PLBs. An external clock Clk 14 supplied to the entire device is buffered by buffer 12 and then distributed by first level distribution buffers 13a–13d. Each first level distribution buffer 13a–13d in turn supplies the clock signal to second level distribution buffers 15a–15d that supply the clock signal 16a–16d to a set of PLBs 11.

Figure 3:
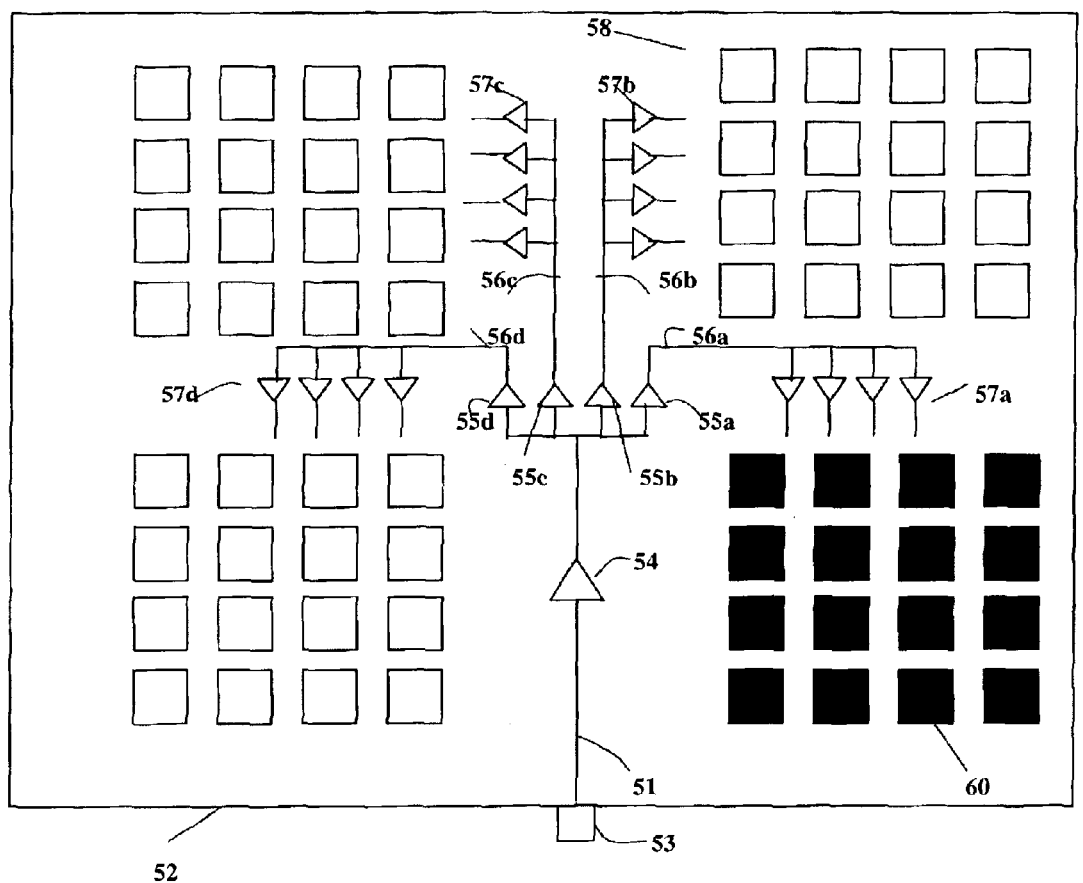
FIG. 3 shows a conventional example of a hierarchical clock tree in a programmable logic device.

FIG. 3 shows an implementation of a conventional clock tree in a programmable logic device 52 such as an FPGA. Clock pin 53 of the device receives the clock signal 51 from an external source (not shown). First level buffer 54 supplies the clock signal to second level buffers 55a–55d. The output 56a–56d of each second level buffer 55a–55d drives a set of third level buffers 57a–57d. Each third level buffer supplies the clock to a PLB 60. Often, only some of the PLBs 60 utilize sequential elements for desired functions while other PLBs 58 do not utilize sequential elements. The clock supplied to these PLBs with unused sequential elements remains active thereby resulting in unnecessary power dissipation in these PLBs.

Figure 4:
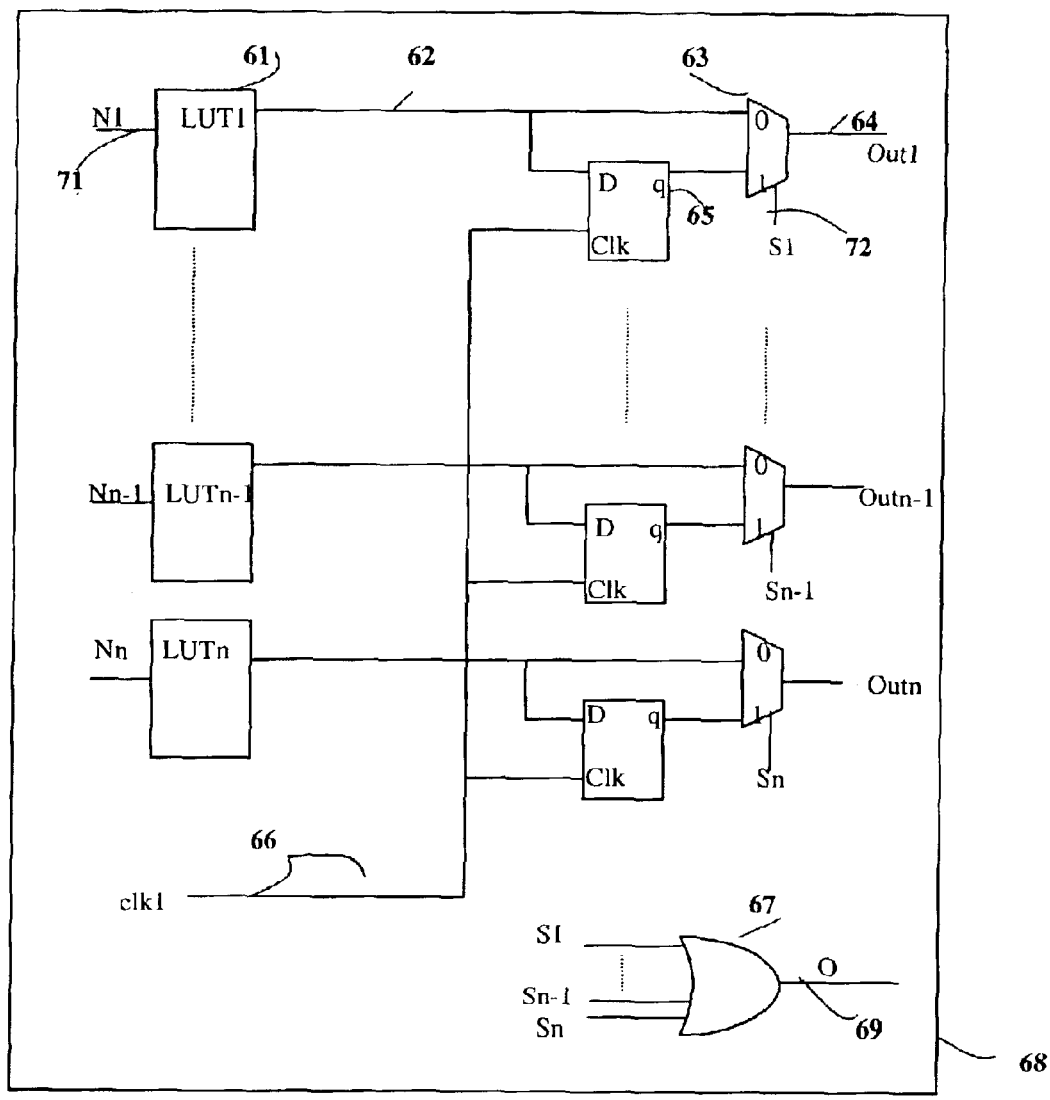
FIG. 4 shows an implementation of an embodiment of the invention in a Programable Logic Block (PLB).

FIG. 4 is a block diagram of a programmable logic block 68 of an FPGA according to an embodiment of the present invention. A programmable logic block 68 includes a number of Look Up Tables (LUT) 61 with an equal number of sequential elements (flip flops/latches) 65 each of which is associated with a LUT 61. Each LUT 61 has N inputs 71 and one output 62. The output 62 can be connected to the external routing channel directly or after registering by a sequential element 65. This selective connection is implemented by a configurable multiplexer 63, which selects the final output 64 for external routing. Multiplexer 63 is controlled by configurable element output S1 72. If select signal S1 72 for multiplexer is "0", then logic element output 61 is connected to final output 64 while if select signal S1 72 is "1", then the registered output is selected for final output 64. In other words, select signal S1 72 is "1" when a sequential function is required while it is "0" when only combinatorial output is desired. If all the sequential elements in a PLB 68 are not used, then all the respective select signals S1 to Sn are "0". Connecting the select signal 72 to a control logic (here simply an OR gate) 67 provides a control output 69 that can be used to gate the clock tree output (not shown) to the PLB 68.

Figure 5:
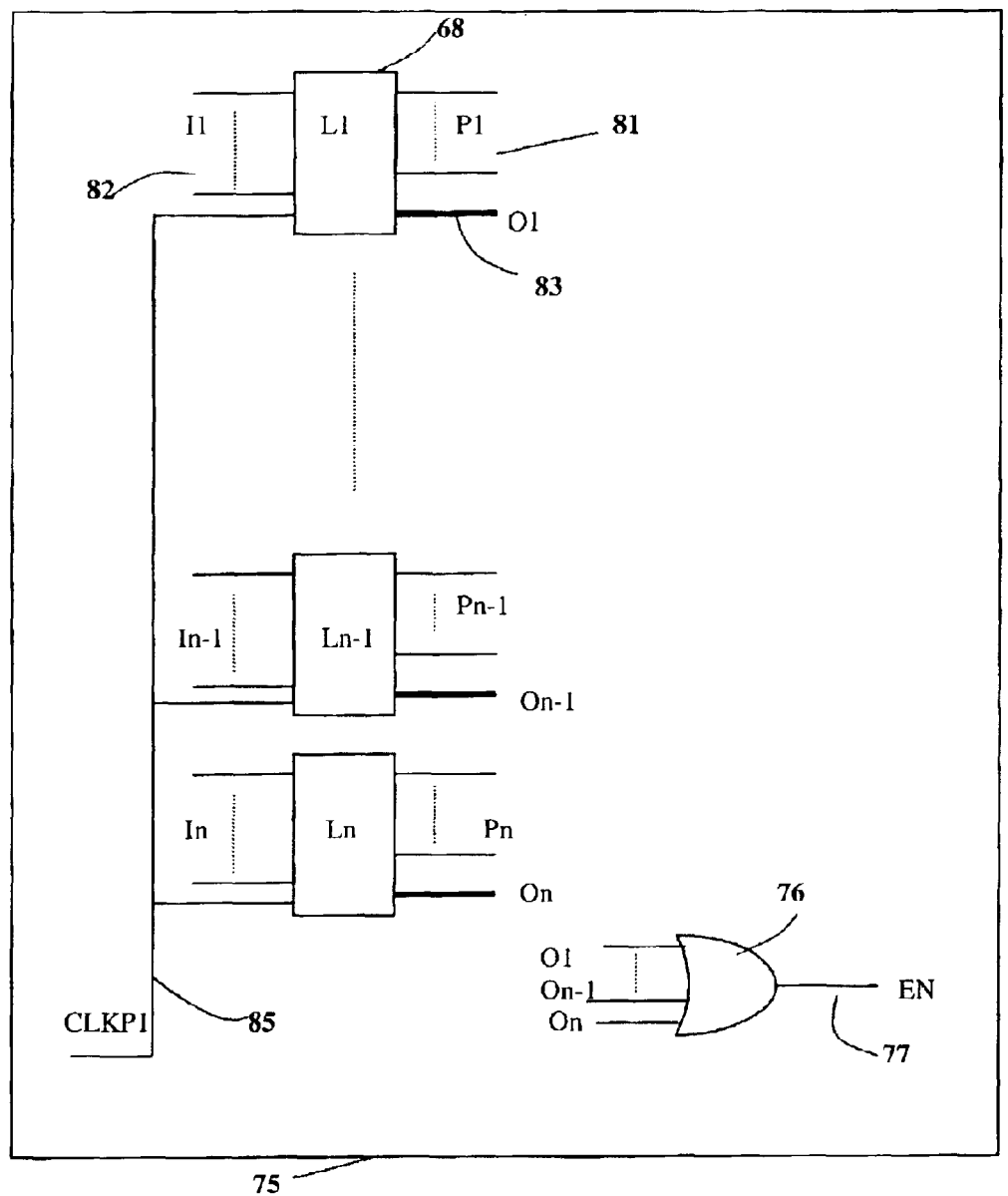
FIG. 5 shows an embodiment of the invention as applied to a hierarchical cluster of PLBs.

FIG. 5 is a block diagram for implementing an embodiment of the invention in a hierarchy of programmable logic blocks. A cluster 75 of 'n' programmable logic blocks 68 according to an embodiment of the present invention receives a common block signal CLKP1 85. Each programmable logic block receives 'I' inputs 82 and generates 'P' outputs 81. At the same time, each programmable logic block also generates a control signal "O1" to "On" 83 that is "0" if no sequential element 65 is used in that programmable logic block 68 and is a "1" if at least one sequential element is used. The control signals "O1" to On" are connected to control logic 76 that enables/disables clock signals CLKP1 85 for the entire cluster. If all the control signals "O1" to "On" are "0", it implies that none of the PLBs uses any sequential elements and the control logic 76, therefore, disables the CLKP1 85 signal by outputting a "0" as "EN" 77.

Figure 6:
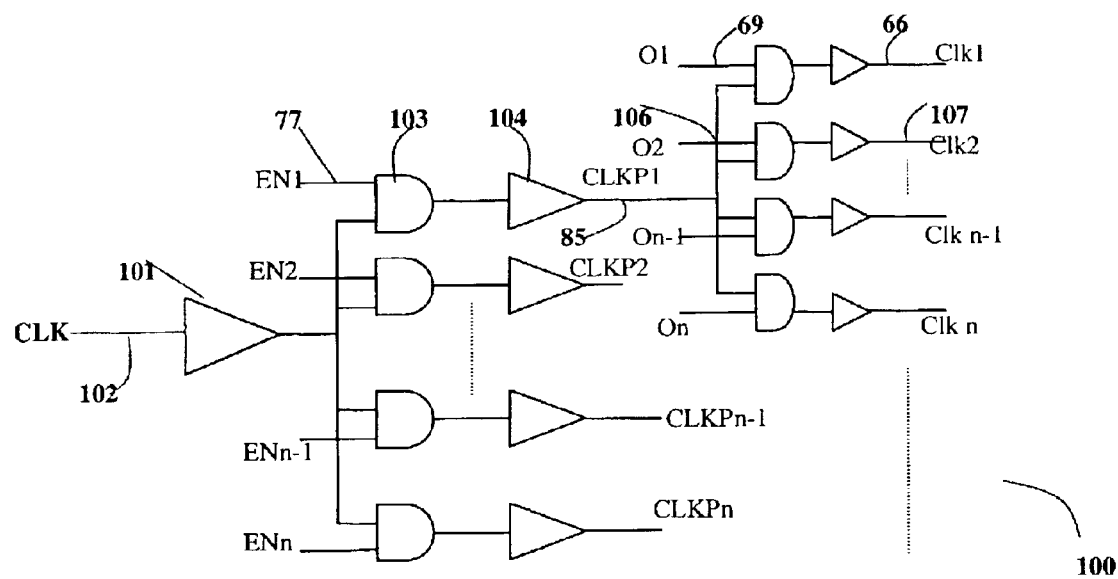
FIG. 6 shows an application of an embodiment of the invention to a clock tree.

FIG. 6 shows a clock tree 100 according to an embodiment of the present invention for reducing the power consumption in an FPGA device. A clock signal 102 supplied to the clock input is first buffered by buffer 101 and then distributed by a tree using control gates 103 and buffers 104. At the first level, these control gates 103 are controlled by individual enable signals EN1 to ENn 77 that enable or disable individual branches of the clock tree 100. If signal EN1 77 is inactive, it disables clock signal CLKP1 85, which in turn disables clock signals CLK1 to CLKn 66 at the leaves of that branch. The enable signals are generated by the clock control logic in the PLB cluster of the associated branch as described in FIG. 5. Similarly, enable signals O1 to On 69 control the gate to enable or disable individual branches of the clock signals CLK1 to CLKn 66. The enable signals are generated by the clock control logic in the PLB of the associated branch as described in FIG. 4.

Figure 7:
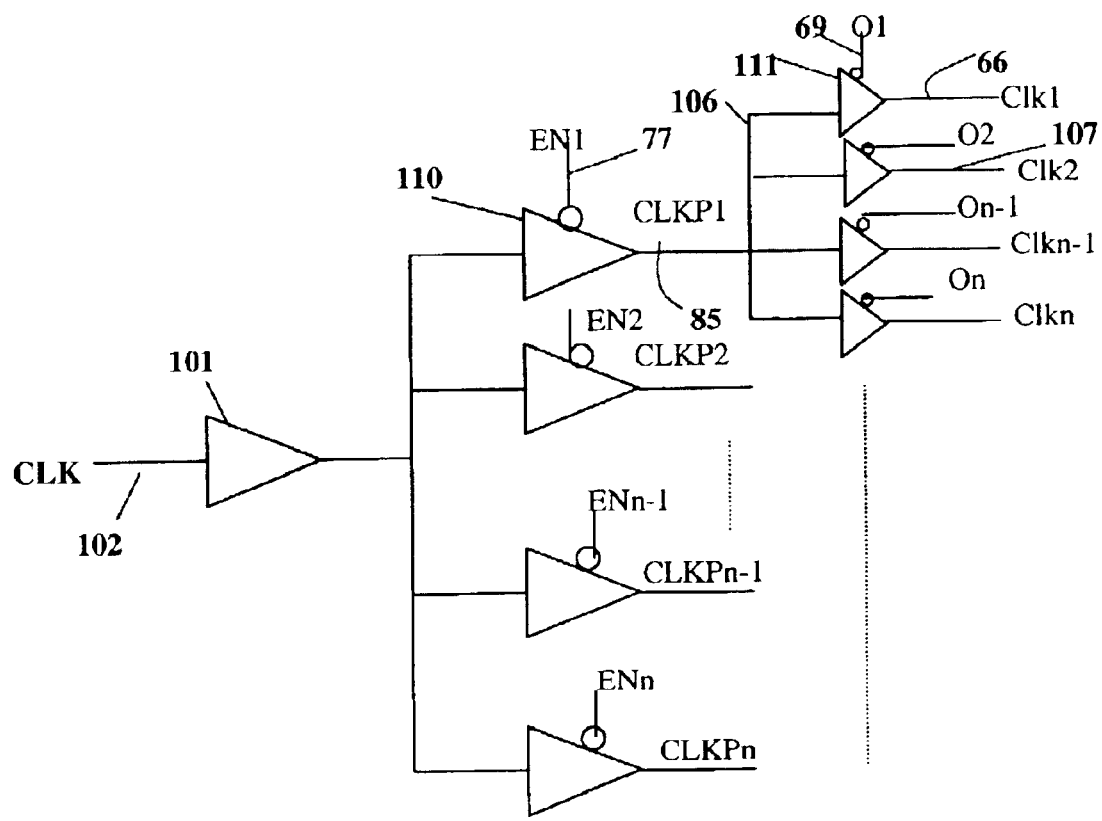
FIG. 7 shows another implementation of an embodiment of the invention for a clock tree.

FIG. 7 shows another arrangement of an embodiment of the invention for controlling a clock tree 100 using tri-state buffer 110 instead of control gates. The enable signals EN1 to ENn 77 control the enable/disable inputs of the associated tri-state buffers 110. These enable signals are generated by the clock control logic in the PLB cluster of the associated branch as described in FIG. 5. Similarly, control signals O1 to On 69 control the enable/disable inputs of the tri-state buffers 111 at the final level (leaves) of the clock tree 100. These enable signals are generated by the clock control logic in the PLB of the associated branch as described in FIG. 4.

Figure 8:
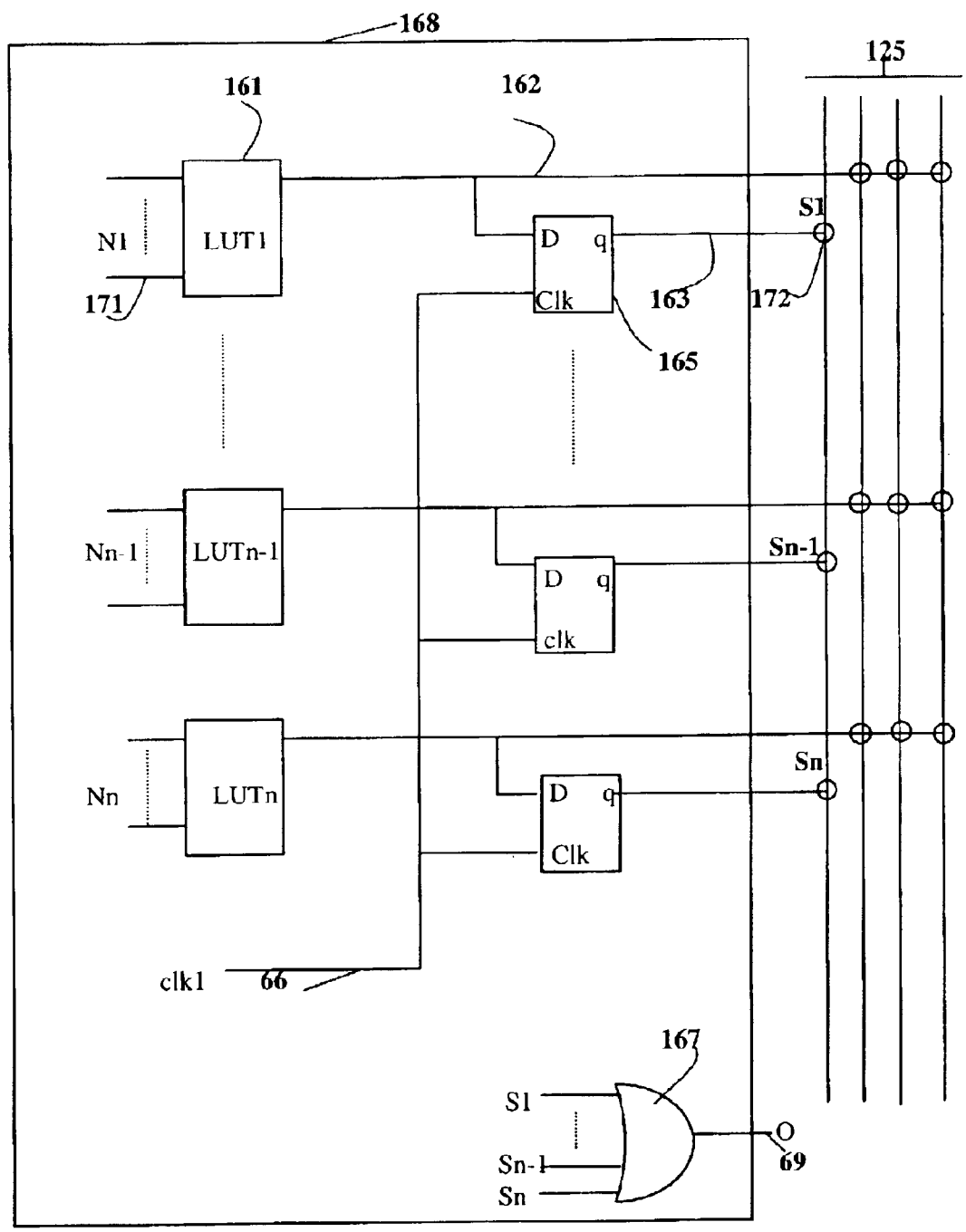
FIG. 8 shows a scheme for implementation of an embodiment of the invention using the switch matrix of an FPGA.

FIG. 8 shows an embodiment of the invention wherein the implementation of the control signal generation circuitry for a PLB 168 in an FPGA uses the programmable switch matrix 125 of the FPGA. The output 163 of each flip flop 165, as well as the output from the LUT 162, are brought out to the programmable switch matrix 125 where these are selectively connected to the routing matrix by control switches S1 to Sn 172. The control signals for these switches S1 to Sn 172 are also connected to control element 167 for generating the control output 69.

The programmable array may also include blocks made of sequential elements other than PLB, e.g., I/O blocks for accepting the clock signals from clock distribution networks.

Furthermore, a system such as a computer system may include an integrated circuit such as an FPGA that includes a programmable logic block 68, (FIG. 4), 75 (FIG. 5), or 168 (FIG. 8) according to an embodiment of the invention. Such an integrated circuit may be coupled to another integrated circuit such as a processor or memory. In addition, such a programmable logic block may be embedded in a processor or circuit other than an FPGA.

It will be apparent to those with ordinary skill in the art that the foregoing is merely illustrative intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings.

What is claimed is:

1. In an electronic circuit containing one or more digital deselectable synchronous sequential logic blocks at least one of which is either selected or deselected during operation, an improved clock distribution scheme that reduces power consumption, comprising: identifying means for determining the select/deselect state of each said deselectable synchronous sequential logic block, coupled to disabling means for disabling the clock input to each deselected synchronous sequential logic block.

2. An electronic circuit as claimed in claim 1 wherein said identifying means is a logic circuit that receives the select/deselect signal for each synchronous sequential logic block as an input and provides a defined logic signal when all its inputs are in the deselected state.

3. An electronic circuit as claimed in claim 1 wherein said disabling means is a logic circuit for gating the clock signal to said synchronous sequential logic blocks.

4. An electronic circuit as claimed in claim 1 wherein the clock distribution is arranged in a hierarchical structure and an identifying means and a disabling means is provided for each level of clock hierarchy.

5. An electronic circuit as claimed in claim 4 wherein said identifying means for a higher level of the clock hierarchy receives the outputs from the disabling means at the next lower level of the clock distribution hierarchy at its inputs.

6. An electronic circuit as claimed in claim 4 wherein said disabling means for a particular level of the clock hierarchy receives the output from the identifying means at the same level of the clock hierarchy.

7. In a programmable logic device containing one or more digital deselectable synchronous sequential logic blocks at least one of which is either selected or deselected during operation, an improved clock distribution scheme that reduces power consumption, comprising: identifying means for determining the select/deselect state of each said deselectable synchronous sequential logic block, coupled to disabling means for disabling the clock input to each deselected synchronous sequential logic block.

8. A programmable logic device as claimed in claim 7 wherein said identifying means is a logic circuit that receives the select/deselect signal for each synchronous sequential logic block as an input and provides a defined logic signal when all its inputs are in the deselected state.

9. A programmable logic device as claimed in claim 7 wherein said disabling means is a logic circuit for gating the clock signal to said synchronous sequential logic blocks.

10. A programmable logic device as claimed in claim 7 wherein the clock distribution is arranged in a hierarchical structure and an identifying means and a disabling means is provided for each level of clock hierarchy.

11. A programmable logic device as claimed in claim 10 wherein said identifying means for a higher level of the clock hierarchy receives the outputs from the disabling means at the next lower level of the clock distribution hierarchy at its inputs.

12. A programmable logic device as claimed in claim 10 wherein said disabling means for a particular level of the clock hierarchy receives the output from the identifying means at the same level of the clock hierarchy.

13. In a programmable gate array (PGA) containing one or more digital deselectable synchronous sequential logic blocks at least one of which is either selected or deselected during operation, an improved clock distribution scheme that reduces power consumption, comprising: identifying means for determining the select/deselect state of each said deselectable synchronous sequential logic block, coupled to disabling means for disabling the clock input to each deselected synchronous sequential logic block.

14. A programmable gate array (PGA) as claimed in claim 13 wherein said identifying means is a logic circuit that receives the select/deselect signal for each synchronous sequential logic block as an input and provides a defined logic signal when all its inputs are in the deselected state.

15. A programmable gate array (PGA) as claimed in claim 13 wherein said disabling means is a logic circuit for gating the clock signal to said synchronous sequential logic blocks.

16. A programmable gate array (PGA) as claimed in claim 13 wherein the clock distribution is arranged in a hierarchical structure and an identifying means and a disabling means is provided for each level of clock hierarchy.

17. A programmable gate array (PGA) as claimed in claim 16 wherein said identifying means for a higher level of the clock hierarchy receives the outputs from the disabling means at the next lower level of the clock distribution hierarchy at its inputs.

18. A programmable gate array (PGA) as claimed in claim 16 wherein said disabling means for a particular level of the clock hierarchy receives the output from the identifying means at the same level of the clock hierarchy.

19. A method for reducing power consumption in an electronic circuit containing one or more digital deselectable synchronous sequential logic blocks at least one or which is either selected or deselected during operation, comprising the steps of: identifying the select/deselect state of each deselectable synchronous sequential logic block, and disabling the clock input to each deselected logic block.

20. A method as claimed in claim 19 wherein the select/deselect state of each deselectable logic block is determined by monitoring its select/deselect control signal.

21. A method as claimed in claim 19 wherein the clock input to each deselected logic block is disabled by gating it with a control signal.

22. A method as claimed in claim 19 applied to a hierarchical clock distribution arrangement wherein the identification and disabling is implemented for each level of the clock hierarchy.

23. A method as claimed in claim 22 wherein the disabling for a particular level of the clock hierarchy is based on the monitoring of the disabling signals for the lower levels of the clock hierarchy.

24. An integrated circuit, comprising:
a logic circuit operable to receive a clock signal;
a utilization circuit operable to determine whether the logic circuit is configured to provide data to another circuit; and
a disable circuit operable to uncouple the clock signal from the logic circuit if the utilization circuit determines that the logic circuit is not configured to provide data to another circuit.

25. The integrated circuit of claim 24, further comprising a clock circuit operable to generate the clock signal.

26. The integrated circuit of claim 24 wherein the utilization circuit is operable to:
receive a utilization signal corresponding to the logic circuit;
determine that the logic circuit is configured to provide data if the utilization signal has an active value; and
determine that the logic circuit is not configured to provide data if the utilization signal has an inactive value.

27. The integrated circuit of claim 24 wherein:
the utilization circuit is operable to,
generate an disable signal having an inactive value if the logic circuit is configured to provide data, and
generate the disable signal having an active value if the logic circuit is not configured to provide data; and
wherein the disable circuit is operable to,
couple the clock signal to the logic circuit if the disable signal has the inactive value, and
uncouple the clock signal from the logic circuit if the disable signal has the active value.

28. The integrated circuit of claim 24 wherein the logic circuit comprises a flip-flop.

29. The integrated circuit of claim 24 wherein the disable circuit comprises a tri-statable buffer having an input node operable to receive the clock signal, an output node coupled to the logic circuit, and a tri-state node operable to receive a disable signal from the utilization circuit.

30. The integrated circuit of claim 24 wherein the disable circuit comprises a logic gate having a first input node operable to receive the clock signal, an output node coupled to the logic circuit, and a second input node operable to receive a disable signal from the utilization circuit.

31. An electronic system, comprising:
a first integrated circuit, comprising,
a logic circuit operable to receive a clock signal,
a utilization circuit operable to determine whether the logic circuit is configured to
provide data to another circuit, and
a disable circuit operable to uncouple the clock signal from the logic circuit if the utilization circuit determines that the logic circuit is not configured to provide data to another circuit.

32. The electronic system of claim 31 wherein the first integrated circuit comprises a field-programmable gate array.

33. The electronic system of claim 31, further comprising a second integrated circuit coupled to the first integrated circuit.

34. A method comprising:
determining whether a logic circuit is coupled to provide data to another circuit; and
uncoupling a clock signal from the logic circuit if the logic circuit is not coupled to provide data to the other circuit.

35. A method, comprising:
determining whether each logic circuit of a group of logic circuits is coupled to provide data to another circuit; and
disabling a clock signal to the group of logic circuits if none of the logic circuits are coupled to provide data to another circuit.

* * * * *